(12) United States Patent
Chuang et al.

(10) Patent No.: US 9,716,222 B1
(45) Date of Patent: Jul. 25, 2017

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Harry-Hak-Lay Chuang, Paya Lebar Crescent (SG); Tien-Wei Chiang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/130,159

(22) Filed: Apr. 15, 2016

(51) Int. Cl.
| | |
|---|---|
| *G11C 11/16* | (2006.01) |
| *H01L 43/02* | (2006.01) |
| *H01L 43/08* | (2006.01) |
| *H01L 43/10* | (2006.01) |
| *H01L 43/12* | (2006.01) |
| *H01L 27/22* | (2006.01) |

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ....... G11C 11/16; G11C 11/161; H01L 43/02; H01L 43/08; H01L 45/1233
See application file for complete search history.

(56) References Cited

U.S. PATENT DOCUMENTS

| | | | |
|---|---|---|---|
| 2011/0089507 A1* | 4/2011 | Mao | ........................ H01L 27/222 257/421 |
| 2016/0072050 A1* | 3/2016 | Yoshikawa | .............. H01L 43/08 257/421 |
| 2017/0054070 A1* | 2/2017 | Bak | .......................... H01L 43/02 |

* cited by examiner

*Primary Examiner* — Raj R Gupta
(74) *Attorney, Agent, or Firm* — WPAT, P.C., Intellectual Property Attorneys; Anthony King

(57) ABSTRACT

A semiconductor structure is disclosed. The semiconductor structure includes: an $N^{th}$ metal layer; a bottom electrode over the $N^{th}$ metal layer; a seed layer over the bottom electrode; a magnetic tunneling junction (MTJ) over the seed layer; a top electrode over the MTJ; and an $(N+1)^{th}$ metal layer over the top electrode; wherein the seed layer has a thickness greater than about one-third of a thickness of the MTJ. Another semiconductor structure is also disclosed. The semiconductor structure includes: a bottom electrode; a seed layer over the bottom electrode; a magnetic tunneling junction (MTJ) over the seed layer; and a top electrode over the MTJ; wherein from a cross-sectional view, the seed layer and the MTJ together have a substantial trapezoidal or rectangular shape, and a slope turning point of a sidewall of the substantial trapezoidal or rectangular shape is at a sidewall of the seed layer. An associated manufacturing method is also disclosed.

16 Claims, 17 Drawing Sheets

SEMICONDUCTOR STRUCTURE AND METHOD FOR MANUFACTURING THE SAME

BACKGROUND

Semiconductor memories are used in integrated circuits for electronic applications, including radios, televisions, cell phones, and personal computing devices. One type of semiconductor memory device involves spin electronics, which combines semiconductor technology and magnetic materials and devices. The spin of electrons, through their magnetic moments, rather than the charge of the electrons, is used to indicate a bit.

One such spin electronic device is a magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
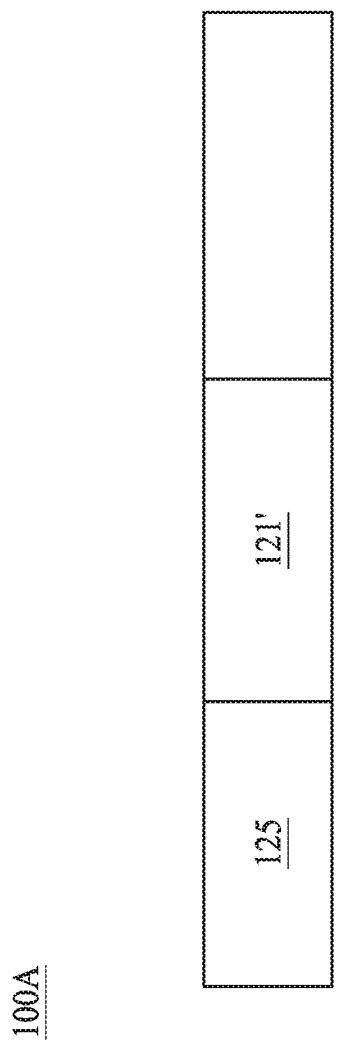
FIGS. 1 to 17 are cross-sectional views of an MRAM cell region structure fabricated at various stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The development of embedded magnetoresistive random access memory (MRAM) cells in CMOS structures has been continuously enhanced. A semiconductor circuit with embedded MRAM cells includes an MRAM cell region and a logic region separated from the MRAM cell region. For example, the MRAM cell region may locate at the center of the aforesaid semiconductor circuit while the logic region may locate at a periphery of the semiconductor circuit. Note that the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded. MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

The MTJ is a form of tunneling magnetoresistive (TMR) device in which the relative orientation of uni-directional magnetic moments in parallel, vertically separated upper and lower magnetized layers, controls the flow of spin-polarized electrons tunneling through a very thin dielectric layer (the tunneling barrier layer) formed between those layers. When injected electrons pass through the upper layer, they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times the number of electrons impinging on the barrier layer) depends upon the relative orientation of the magnetizations of magnetic layers above and below the barrier layer.

One of the critical challenges in MRAM technology is the patterning of the MTJ stack materials to form an MRAM cell. The term "stack," as used here, refers to the unpatterned, deposit layered structure of conducting, magnetic and dielectric materials. The phrase, "patterning of the stack," or the like, as used here, refers to the reduction of the lateral dimensions of the stack to the desired dimensions of the cell and to providing the cell with a desired horizontal cross-sectional shape, typically accomplished by etching away portions of the stack peripherally disposed by an etch mask formed on the upper surface of the stack. Unfortunately, shorting or shunting of the current around the MTJ is a critical problem because the existing MTJ stack includes a very thin tunneling barrier layer, typically a layer of AlOx or MgO approximately in a range from about 10 Å to about 20 Å in thickness. Clearly, imprecise patterning could create shorting pathways along the lateral edges of the cell. In addition, precise control of the size and shape of the MTJ cell during its patterning is increasingly important because these factors affect the magnetic and switching properties of the cell.

In MRAM devices, the elimination of electrical shorting is vital to successful mass-production manufacturing. Among all MRAM fabrication processes, MTJ etching is perhaps the most troublesome step in terms of providing a limitation on shorting. The root cause of electrical shorting that results from this step is mainly from shorting of the MTJ dielectric tunneling barrier layer at its outside edge (the etched edge), which is partially due to either an unetched "footing" or a re-deposition of the magnetic byproducts, such as anti-ferromagnetic or ferromagnetic polymers, resulting from the etching process. The present disclosure provides an MRAM cell region structure having a seed layer thick enough between the MTJ and the bottom electrode to mitigate the above mentioned issues.

FIGS. 1 to 17 are cross-sectional views of an MRAM cell region structure fabricated at various stages, in accordance with some embodiments of the present disclosure. In FIG. 1, a predetermined MRAM cell region 100A is provided. In some embodiments, a transistor structure is pre-formed in a semiconductor substrate (not shown in FIG. 1). The integrated circuit device may undergo further CMOS or MOS technology processing to form various features known in the art. For example, one or more contact plugs, such as silicide regions, may also be formed. The contact features may be coupled to the source and drain. The contact features include silicide materials, such as nickel silicide (Nisi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

As shown in FIG. 1, an $N^{th}$ metal line 121' is patterned in a dielectric layer 125 over the transistor structure. In some embodiments, the $N^{th}$ metal line 121' can be formed of an electroplating operation with a Cu seed layer deposited over the patterned dielectric layer 125. As mentioned above, N is an integer greater than or equal to 1. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 125.

Figure 2:
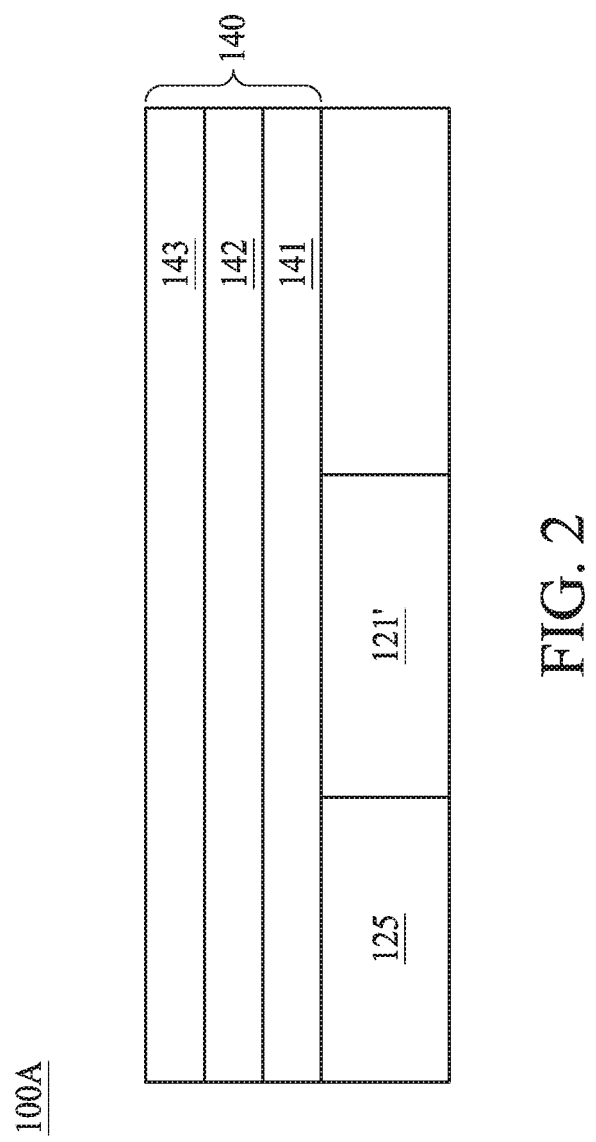

In FIG. 2, a dielectric layer 140 in a form of stacking layers is blanket deposited over a top surface of the $N^{th}$ metal line 121' and a top surface of the dielectric layer 135, in the MRAM cell region 100A. The stacking layers may include a first silicon carbide (SiC) layer 141, a tetraethyl orthosilicate (TEOS)/silicon-rich oxide (SRO) layer 142 and a second SiC layer 143 according to an exemplary embodiment of the present disclosure. The dielectric layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 3:
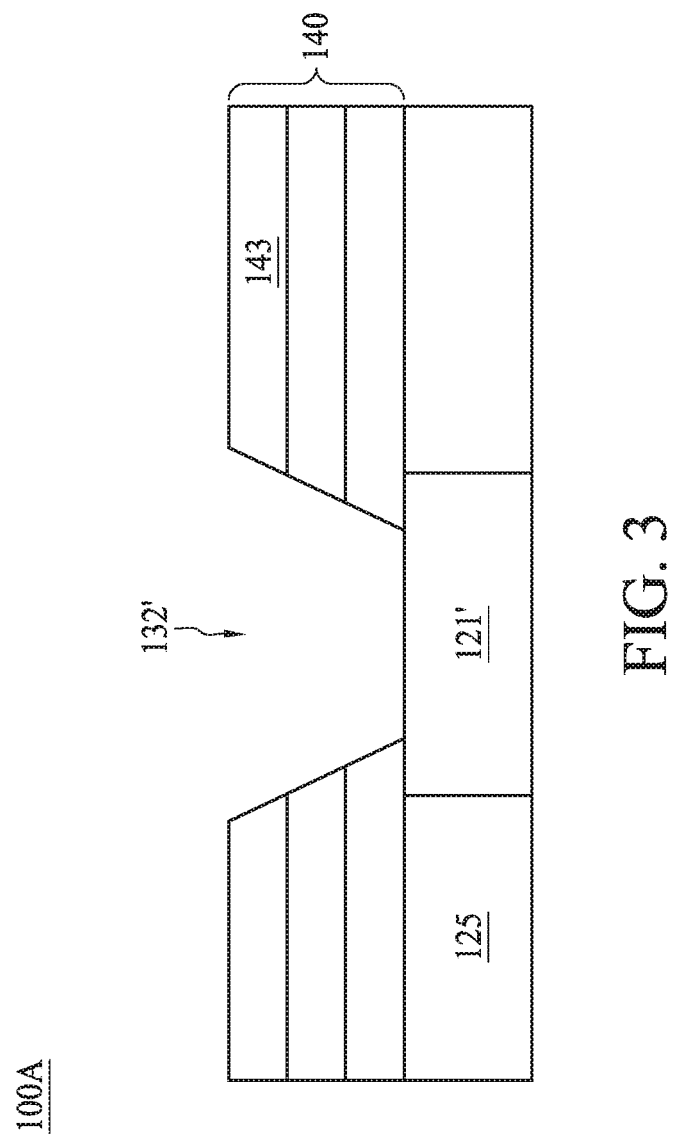

In FIG. 3, a photoresist layer (not shown) is patterned over the dielectric layer 140 to expose a bottom electrode via (BEVA) hole 132' of the MRAM structure. As shown in 3, the BEVA hole 132' is formed in the dielectric layer 140 by a suitable dry etch operation. In some embodiments, the dry etch in the present operation includes reactive ion etch (RIE) adopting fluorine-containing gases. In some embodiments, the present dry etch operation can be any suitable dielectric etch to be formed via trenches in a metallization structure of conventional CMOS technology.

Figure 4:
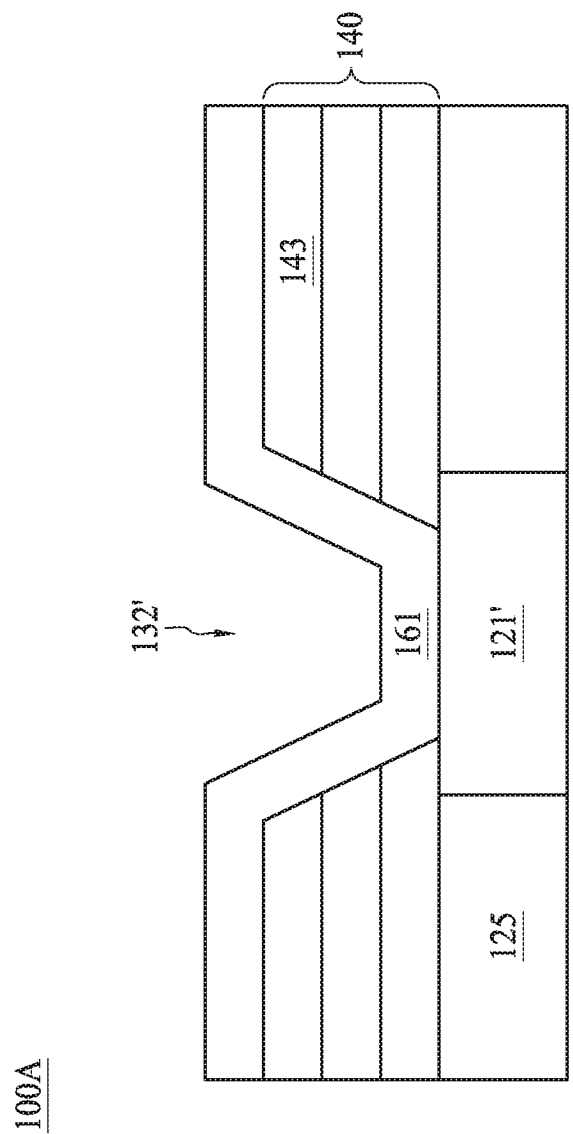
Figure 5:
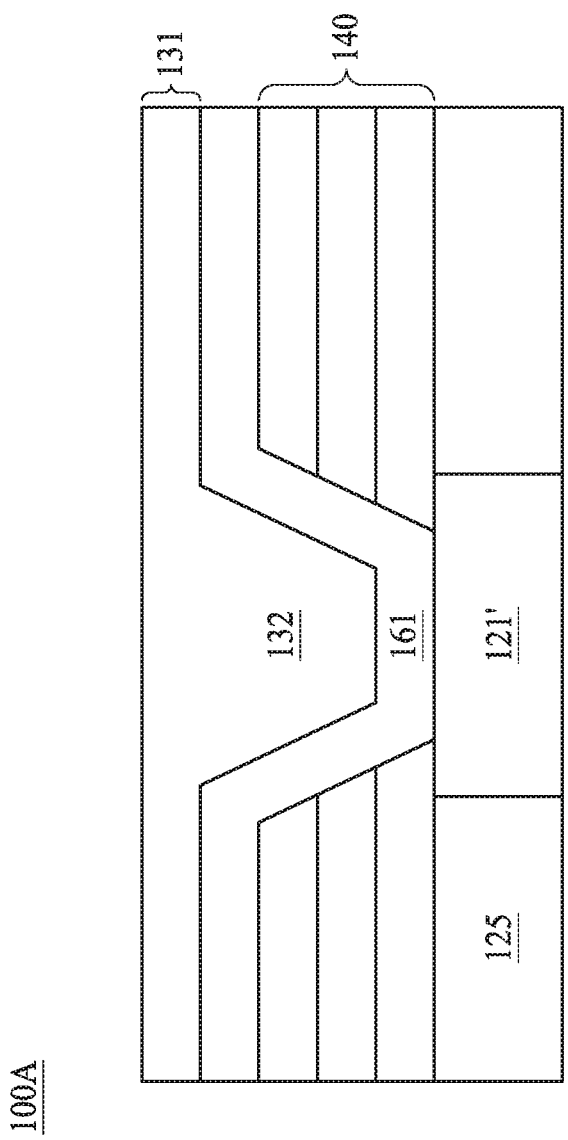

In FIG. 4, a lining layer 161 is blanket lined over the BEVA hole 132' in the MRAM cell region 100A and over the dielectric layer 140. In the exemplary embodiment, the lining layer 161 conformally covers an interior surface of the BEVA hole 132' and a top surface of the dielectric layer 140 as shown in FIG. 4. Subsequently, in FIG. 5, a deposition of BEVA material 132 is conducted to be disposed over the lining layer 161 and the dielectric layer 140. In some embodiments, an overfilling of the BEVA material 132 is carried out. In other words, a level of the BEVA material 132 is at least higher than the top surface of the dielectric layer 140 so that the BEVA hole 132' is substantially filled by the BEVA material 132. The portion overfilling the BEVA hole 132' may be configured to be a bottom electrode 131 of the MRAM. In some embodiments, the BEVA material 132 includes TiN, TaN, W, Al, Ni, Ta, Ru, Co, Cu or the combination thereof, deposited by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 6:
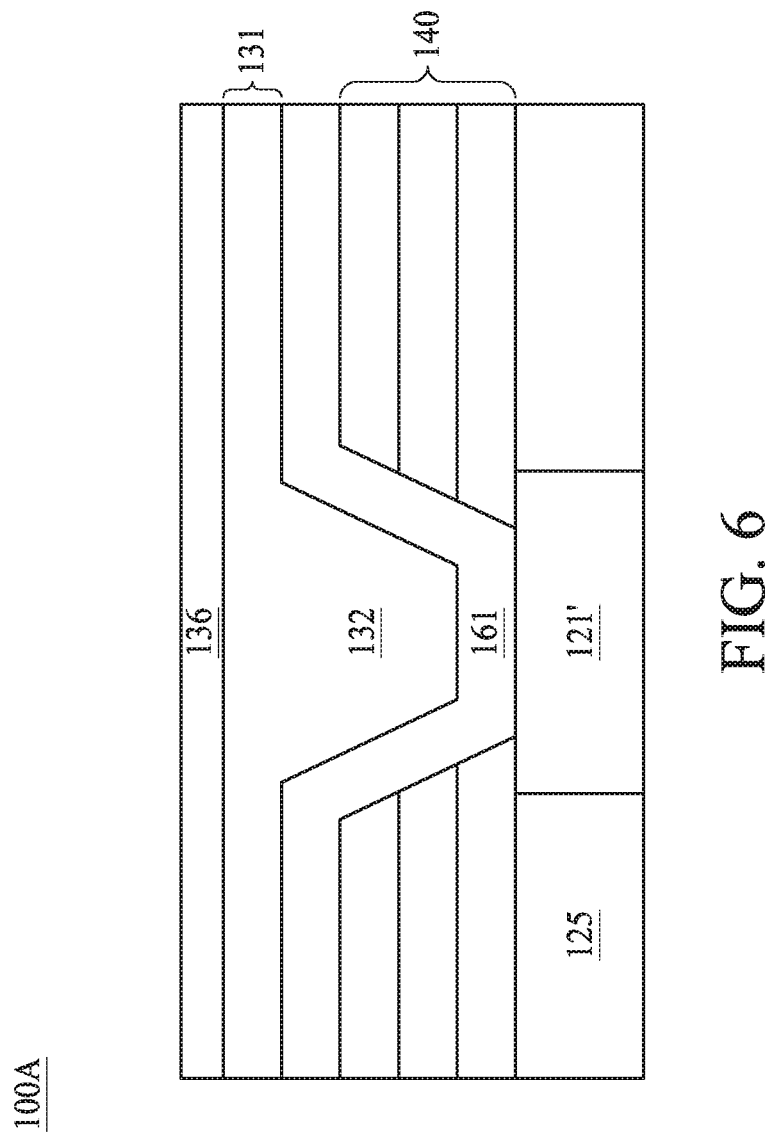

In FIG. 6, a seed layer 136 is formed over the BEVA material 132. In particular, the seed layer 136 may be in a form of stacking layers blanket deposited over a top surface of the bottom electrode 131 of the MRAM in the MRAM cell region 100A according to an exemplary embodiment of the present disclosure. The seed layer 136 may include a lower thick layer and an upper thin layer. The lower thick layer may include Ta, Ru, TiN, TaN, Mg, Nb, Mo, Tc, Ag, Au, Cu, W, Mn, Pt, Pd, V, Cr, Ir, Re, Os, $Al_2O_3$, MgO, TaO, RuO or the combination thereof, deposited by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the lower thick layer may have a thickness in a range from about 50 Å to about 190 Å. In some embodiments, the lower thick layer may have a thickness in a range from about 90 Å to about 240 Å. The upper thin layer may include ferromagnetic or anti-ferromagnetic material, for example, Fe, Co, Ni. The upper thin layer may have a thickness less than about 10 Å and provide functions such as lattice orientation attachment and structural stabilization for the subsequent MTJ layer deposition. Please note that the overall magnetism of the seed layer 136 is negligible since the upper magnetic thin layer is much thinner than the lower non-magnetic thick layer.

The overall seed layer 136 is configured to have a thickness greater than a height of either an unetched "footing" or a re-deposition, including the magnetic byproducts such as anti-ferromagnetic or ferromagnetic polymers, resulting from the etching process in the following steps. According to an exemplary embodiment, the seed layer 136 is configured to have a thickness greater than about one-third of a thickness of an MTJ layer formed subsequently. In some embodiments, the seed layer 136 is configured to have a thickness greater than about one-half of a thickness of an MTJ layer formed subsequently. In some embodiments, the seed layer 136 may have a thickness in a range from about 60 Å to about 200 Å. In some embodiments, the seed layer 136 may have a thickness in a range from about 100 Å to about 250 Å.

Figure 7:
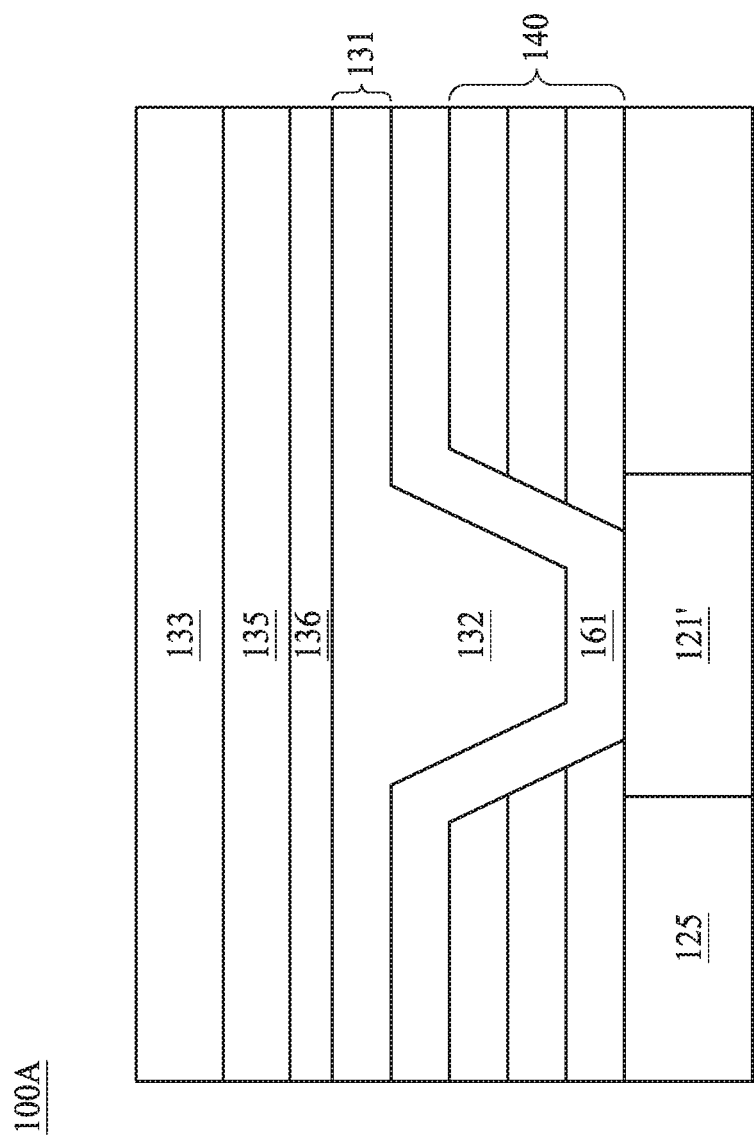

In FIG. 7, an MTJ layer 135 is deposited in a form of multiple material stacks (with details of the multiple material stacks not illustrated in FIG. 7) over the seed layer 136. In particular, at least a stack of the MTJ layer 135 adjacent to the seed layer 136 has a lattice orientation substantially the same with the seed layer 136. In some embodiments, the MTJ layer 135 may have a thickness in a range from about 150 Å to about 200 Å. In some embodiments, the MTJ layer 135 may have a thickness in a range from about 150 Å to about 250 Å. The MTJ layer 135 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer may be formed on the ferromagnetic layer.

Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include an insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ layer 135 may include an anti-ferromagnetic layer in accordance with other embodiments.

Following the formation of the MTJ layer 135, a top electrode layer 133 is deposited over the MTJ layer 135. The top electrode layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer may include TiN, TaN, Ta or Ru.

Figure 8:
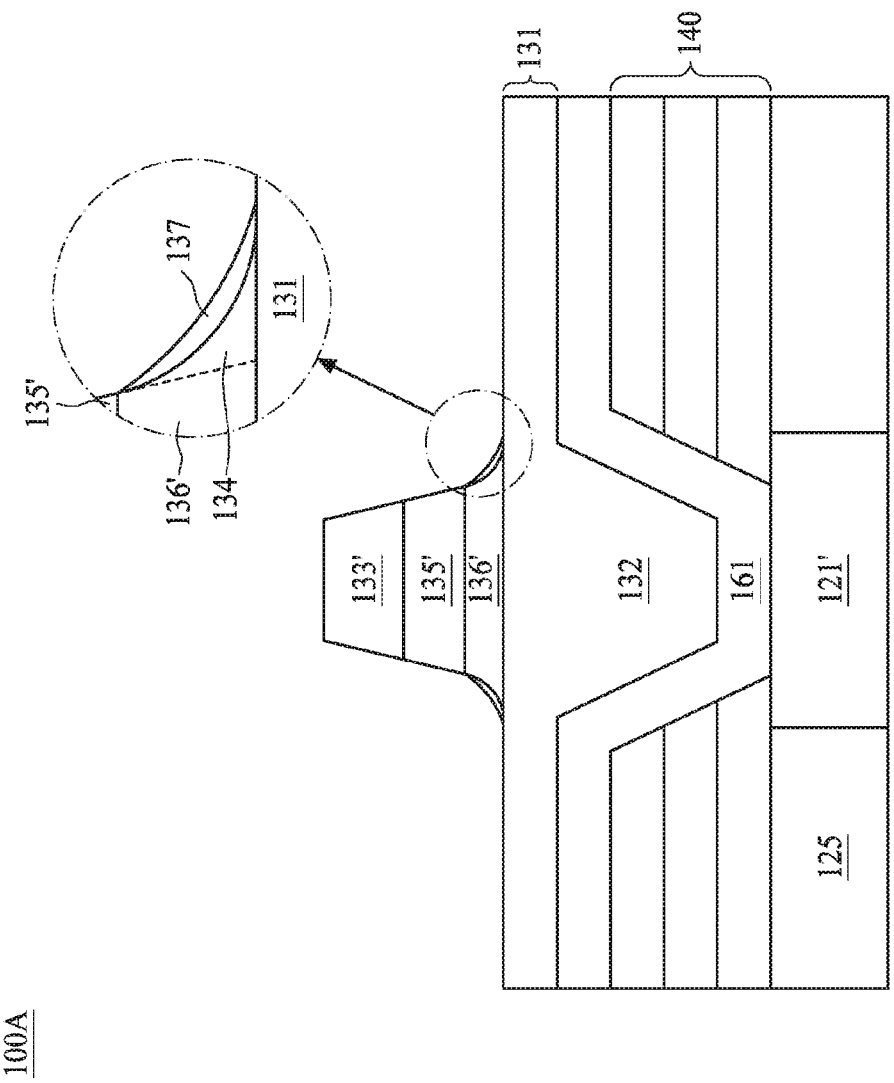

After the seed layer 136, the MTJ layer 135 and the top electrode layer 133 are formed over the bottom electrode layer, and a mask layer (not shown) is formed over the top electrode layer 133 for the ensuing MRAM structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the top electrode layer 133, the MTJ layer 135 and the seed layer 136 to form a top electrode 133', an MTJ 135' and a seed layer 136' as shown in FIG. 8. In some embodiments, the MTJ 135' and the top electrode 133' are formed by a Reactive Ion Etch (RIE) plasma method. In some embodiments, the seed layer 136', the MTJ 135' and the top electrode 133' together may have a substantial trapezoidal or rectangular shape from a cross-sectional view. However, this is not a limitation of the present disclosure. In some embodiments, the seed layer 136', the MTJ 135' and the top electrode 133' together may form other shapes from a cross-sectional view.

As can be seen from the locally enlarged portion in FIG. 8, the patterning process has left a footing profile 134 at a bottom edge of the seed layer 136'. In particular, the footing profile 134 is located between the top surface of the bottom electrode 131 and a sidewall of the seed layer 136'. Moreover, a re-deposition layer 137, including the magnetic byproducts, such as anti-ferromagnetic or ferromagnetic polymers, has been formed around the bottom edges of the seed layer 136', particularly over the footing profile 134. Because of the existence of the thick seed layer 136', the footing profile 134 is distanced from the MTJ 135' so that the re-deposition layer 137 on the footing profile 134 does not join the MTJ 135' like conventional MRAM cell region structures, i.e., the re-deposition layer 137 is upwardly extending at most to an edge of a top surface of the seed layer 136'.

As can be seen from the cross-sectional view of FIG. 8, the footing profile 134 has a sidewall slope substantially slower than a sidewall of the MTJ 135', and the footing profile 134 has a height substantially lower than a height of the seed layer 136'. In particular, the side wall of the MTJ 135' may have a substantially uniform slope, and the sidewall of the seed layer 136' may have at least one slope transition caused by the footing profile 134 and the re-deposition layer 137. In other words, from a cross-sectional view, the side wall of the substantial trapezoidal or rectangular shape comprised of the seed layer 136', the MTJ 136' and the top electrode 133' have a slope turning point at the side wall of the seed layer 136'. Please note that the footing profile 134 is substantially comprised of the unetched seed layer 136'. As such, the footing profile 134 is substantially comprised of non-magnetic materials having magnetism much lower than that of the MTJ 135'. In this way, magnetic byproducts are less likely to be attracted to re-deposit on the footing profile 134, and the re-deposition layer 137 can be thinner than that of the conventional MRAM cell region structures.

Figure 9:
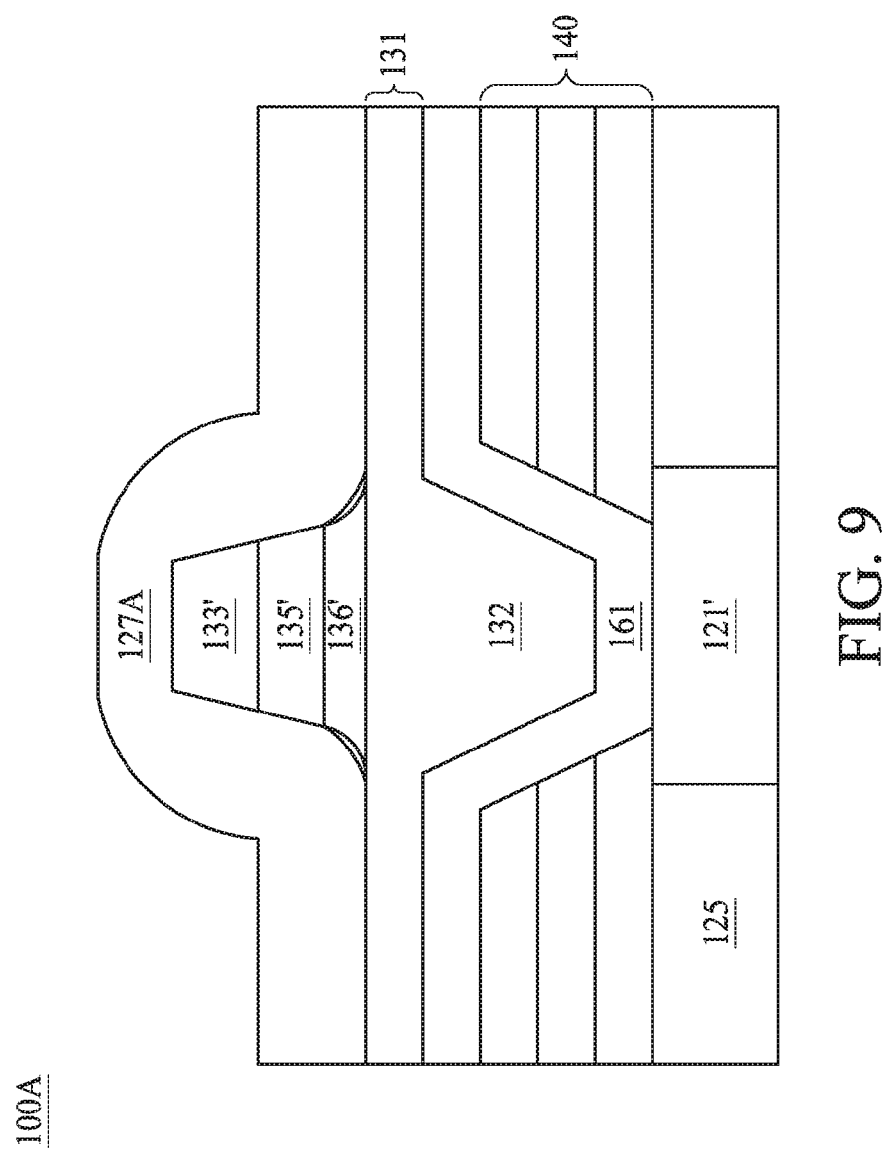
Figure 10:
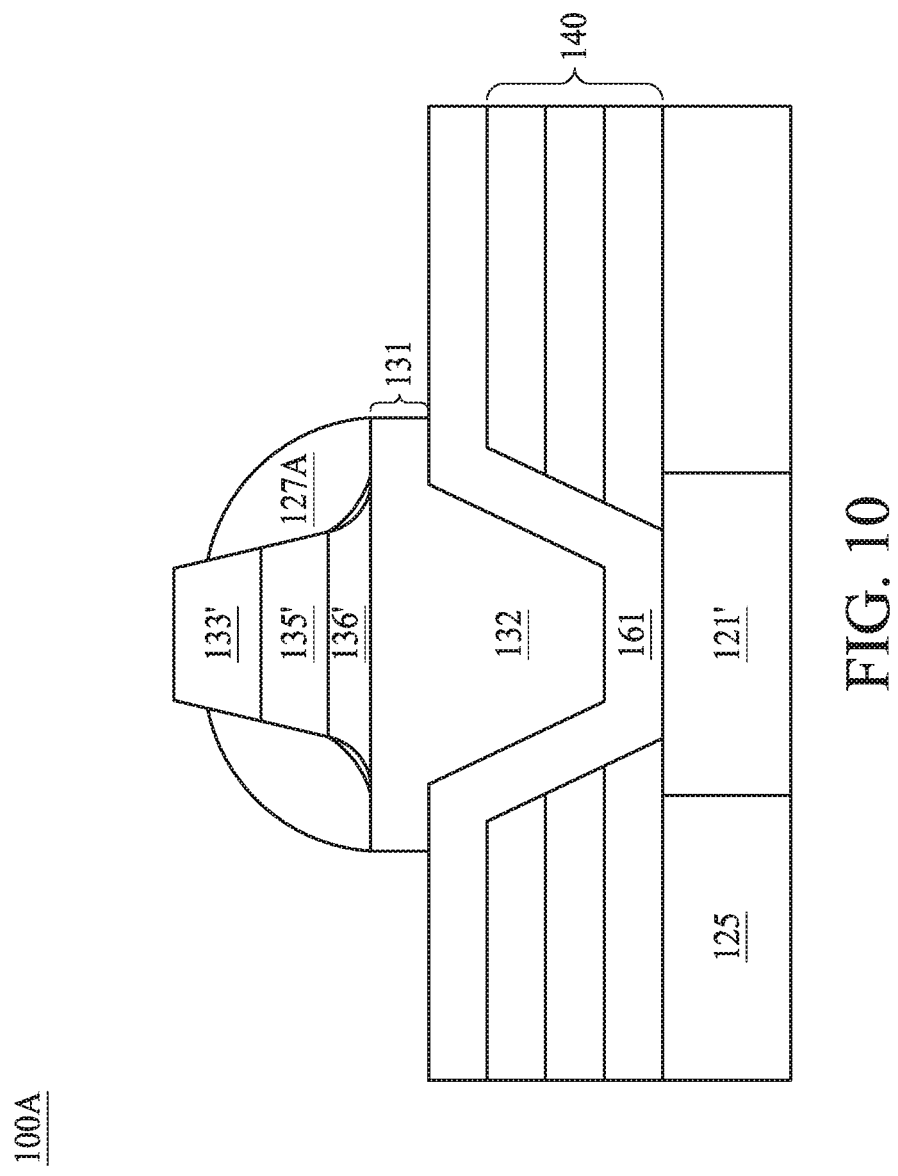

Subsequently, a first dielectric layer 127A possesses a thickness of from about 50 Å to about 300 Å and is formed over the seed layer 136', the MTJ 135' and the top electrode 133' as shown in FIG. 9. Note that a sidewall of the seed layer 136', a sidewall of the MTJ 135' and a sidewall of the top electrode 133' are surrounded by the first dielectric layer 127A to prevent oxidation or other contamination. Then, as shown in FIG. 10, the first dielectric layer 127A is patterned to expose a top surface of the top electrode 133' and a portion of the bottom electrode 131. The bottom electrode 131 is etched and patterned so that two adjacent MRAMs are electrically decoupled. As can be seen from the cross-sectional view of FIG. 10, the bottom electrode 131 is substantially laterally wider than the seed layer 136', the MTJ 135' and the top electrode 133'.

Figure 11:
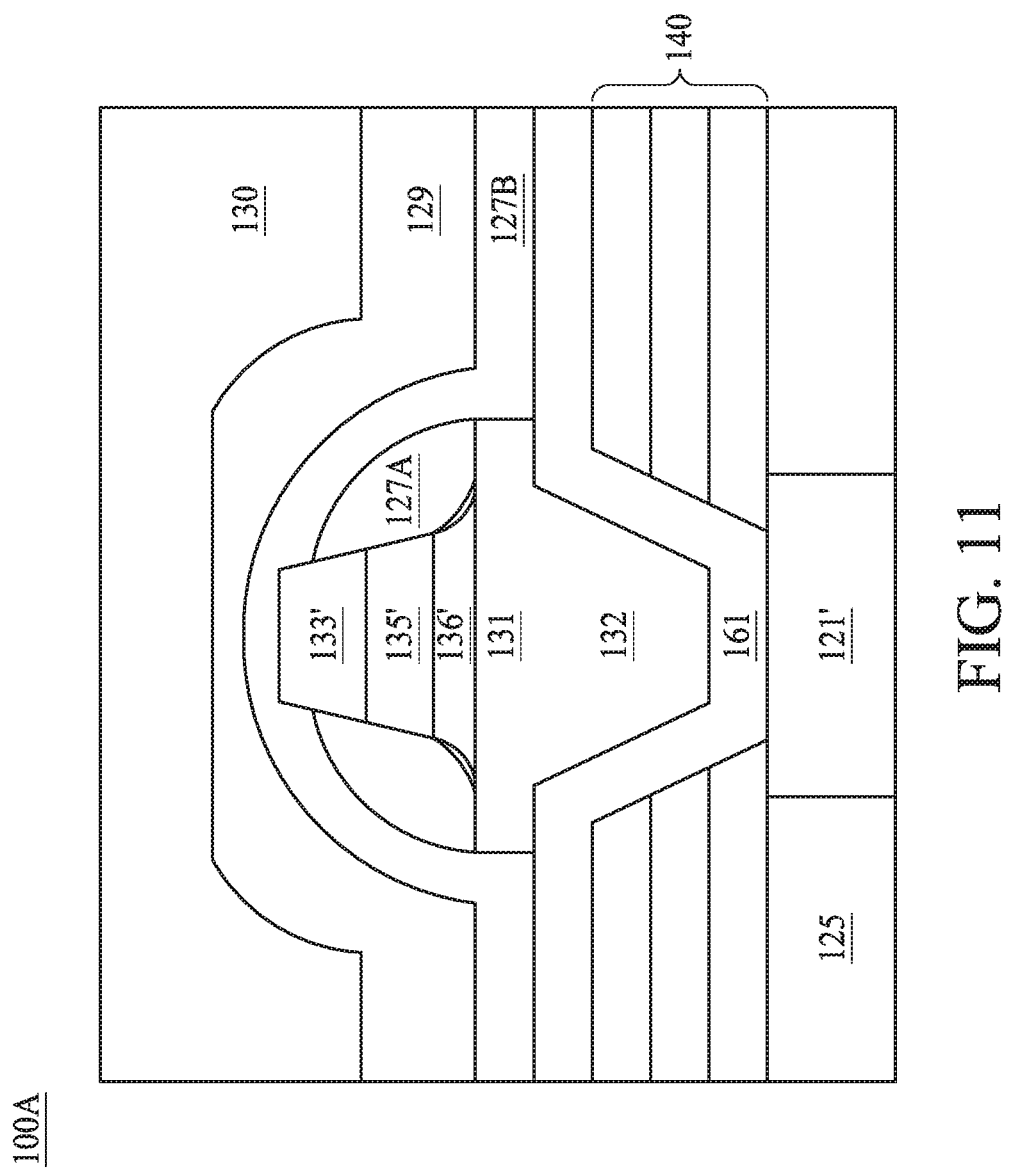

In FIG. 11, a second dielectric layer 127B is conformally deposited over the first dielectric layer 127A and the top electrode 133'. In some embodiments, the second dielectric layer 127B is composed of the same materials, such as nitrides, as the first dielectric layer 127A. A dielectric layer 129 is further formed to conformally cover the second dielectric layer 127B. Optionally, an anti-reflection layer 130 is leveled over the dielectric layer 129 to facilitate the following photolithography operation.

Figure 12:
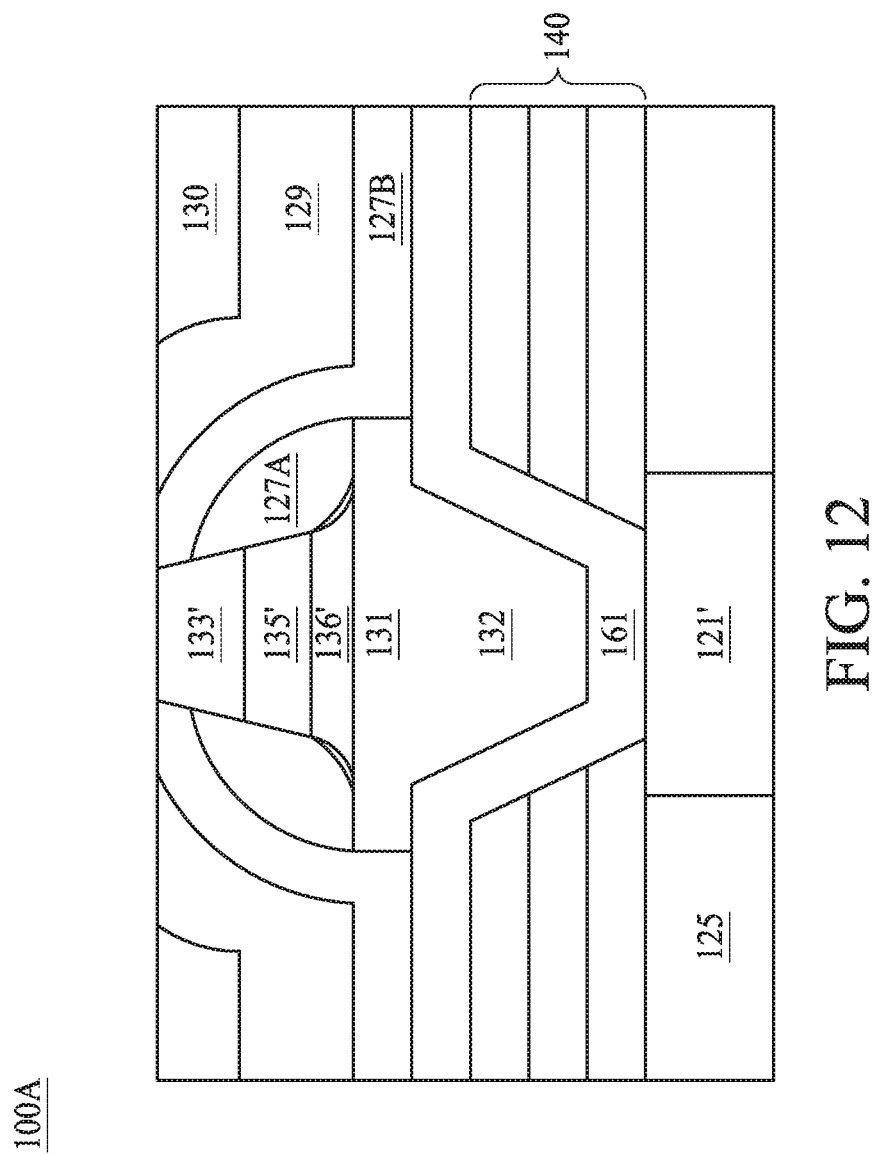

In FIG. 12, a planarization operation is performed on the anti-reflection layer 130 and the dielectric layer 129 such that the top surface of the dielectric layer 129 is substantially flat across the MRAM cell region 100A. As shown in FIG. 12, a non-selective etch is adopted to remove the dielectric layer 129, the anti-reflection layer 130, and the second dielectric layer 127B using $CF_y$-based etchant chemistry, where y is a positive integer. For example, $CF_y$-based etchant chemistry includes $CF_y$ and other etching gases composed of C, and F. In some embodiments, the $CF_y$-based etchant chemistry has a $C_nH_lF_m:CF_y$ volume ratio in a range of from 0 to about 0.1. In some embodiments, the non-selective etch is carried out under 0% to 5% of oxygen gas flow with respect to total gas flow. The non-selective etch is performed by endpoint detection mode so as to stop upon the exposure of the second dielectric layer 127B. Alternatively stated, at the completion of the non-selective etch, the top surface of the top electrode 133' is not exposed.

Figure 13:
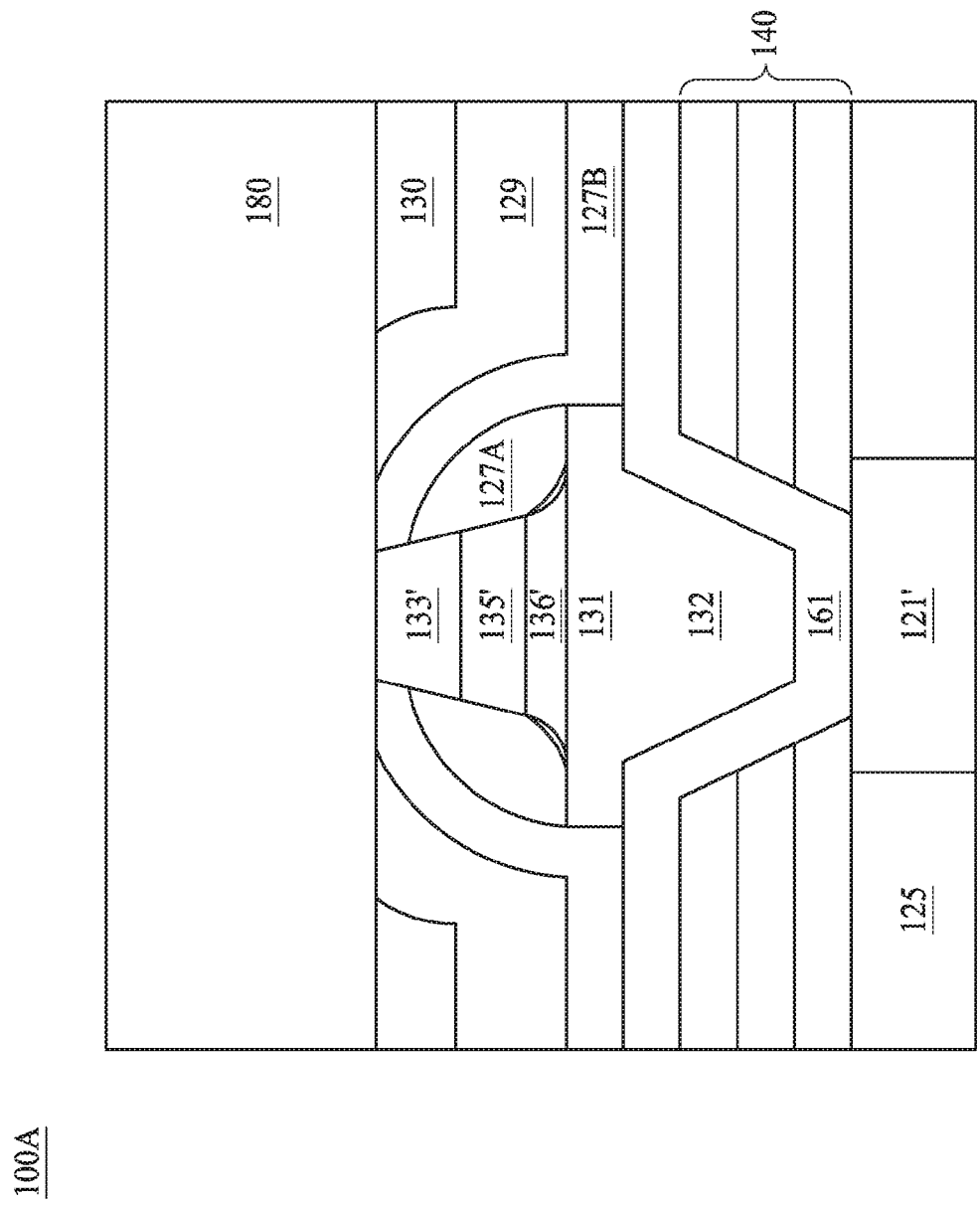
Figure 14:
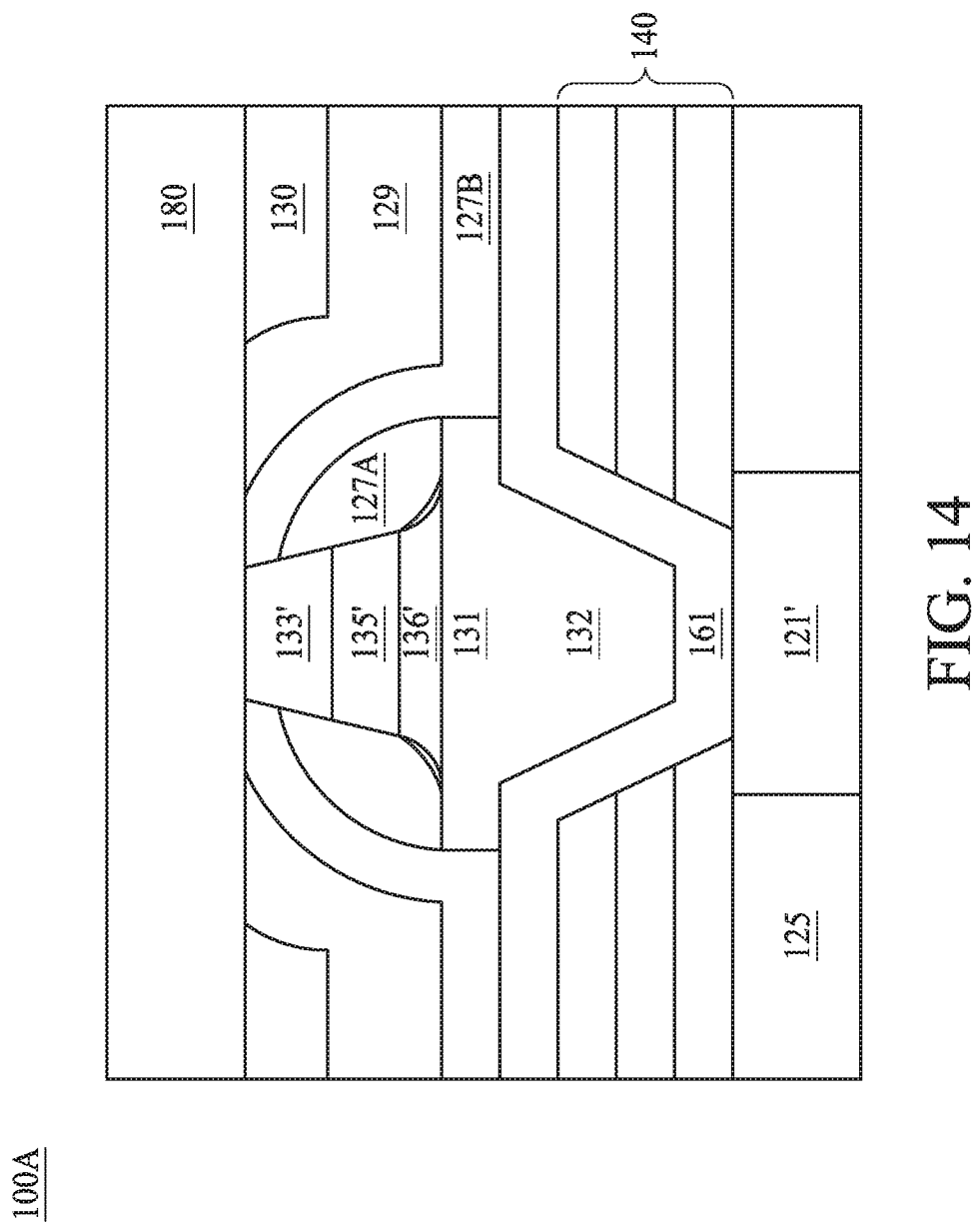
Figure 15:
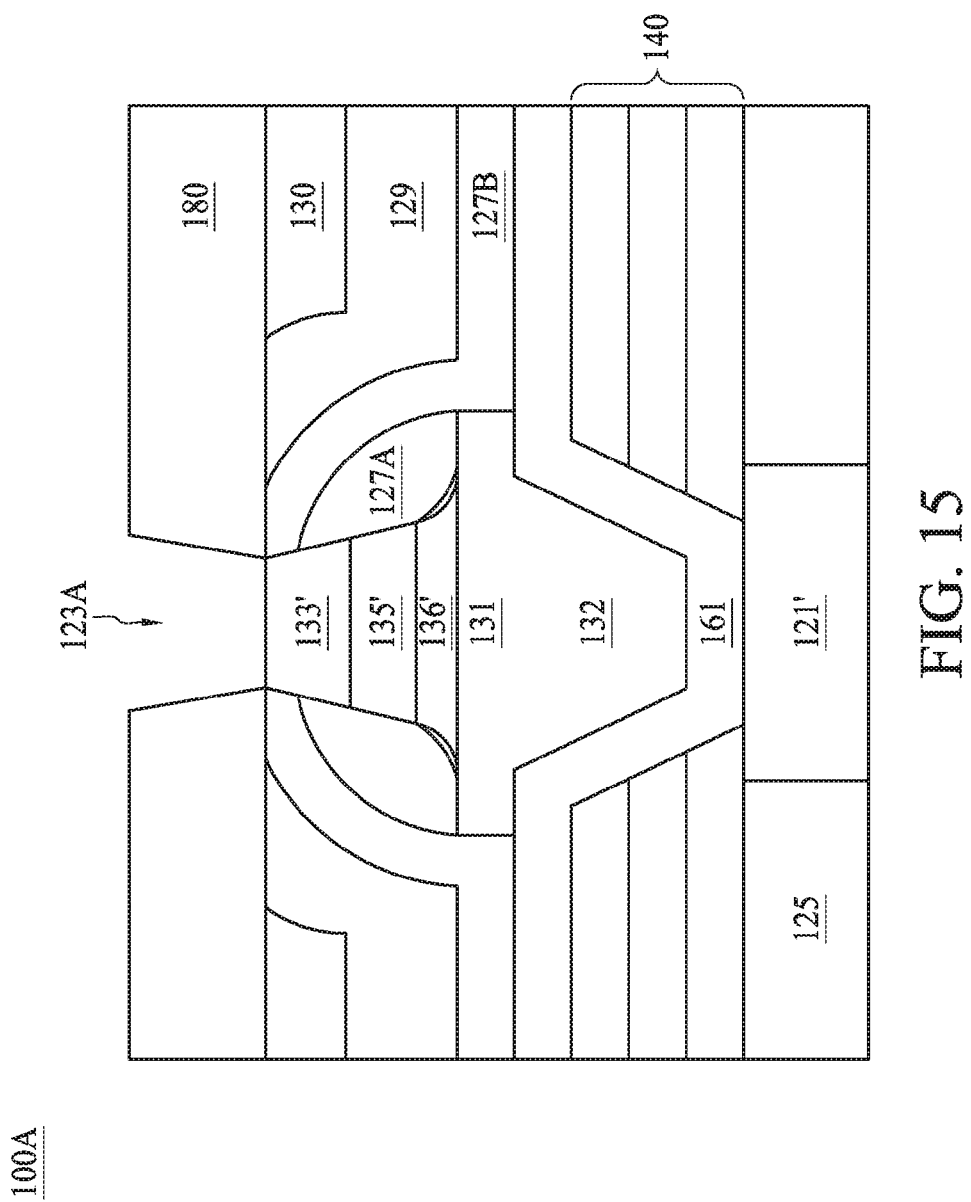

In FIG. 13, a low-k dielectric layer composite 180 is formed to cover the MRAM cell region 100A. In FIG. 14, an etch back operation is performed for the following trench formation in the MRAM cell region 100A. In FIG. 15, a photoresist (not shown) is patterned over the planarized dielectric surface to form trenches for metal lines and metal vias. For example, in the MRAM cell region 100A, a $(N+1)^{th}$ metal line trench 123A is formed over the MTJ 135', exposing a top surface of the top electrode 133' of the MTJ 135'. If the top electrode 133' is composed of a material with a high oxidation rate, such as TaN, a considerable thick oxide layer can be observed on the top surface of the top electrode 133' since said top surface is exposed after the formation of the metal line trench 123A. Conventionally, an oxide bombardment operation is used to remove the oxide layer. If the top electrode 133' is composed of a material with a low oxidation rate, such as TiN, very little or even no oxide layer can be observed on the top surface of the top electrode 133. In this connection, no oxide bombardment operation is required to remove such oxide layer, and the sidewall/bottom integrity of the $N^{th}$ metal via trench and an $(N+1)^{th}$ metal line trench 123B can be preserved.

Figure 16:
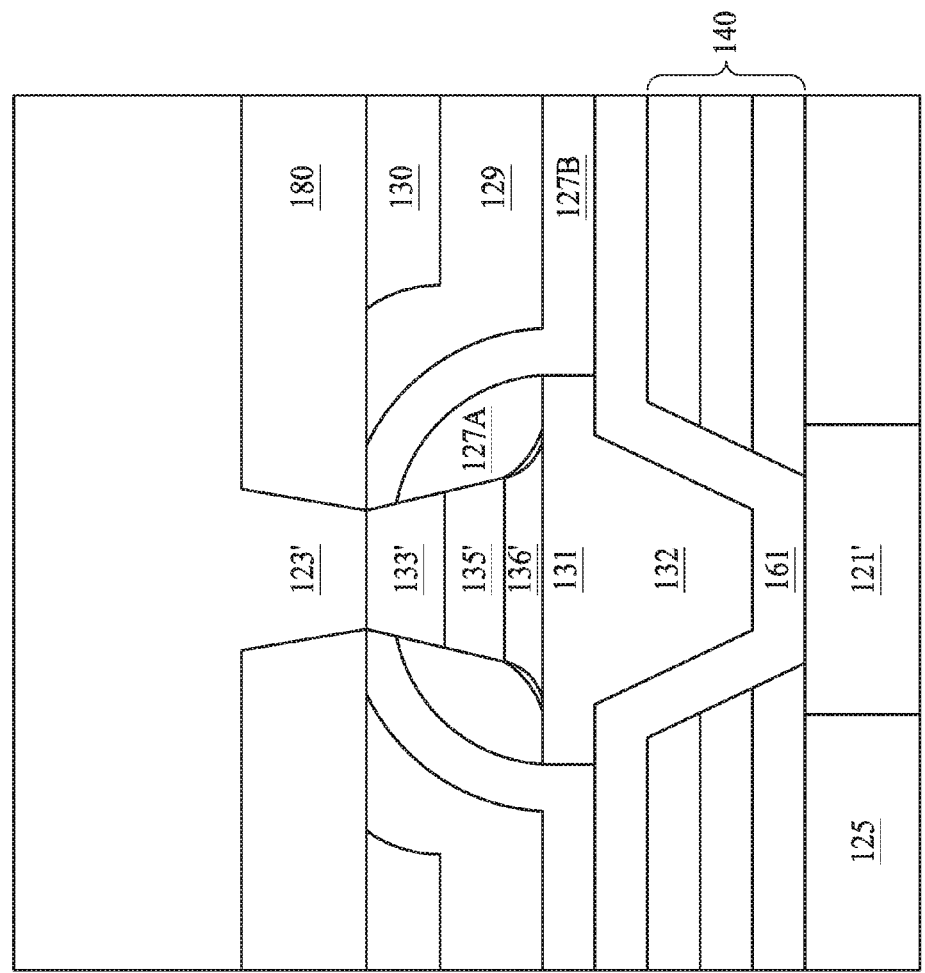
Figure 17:
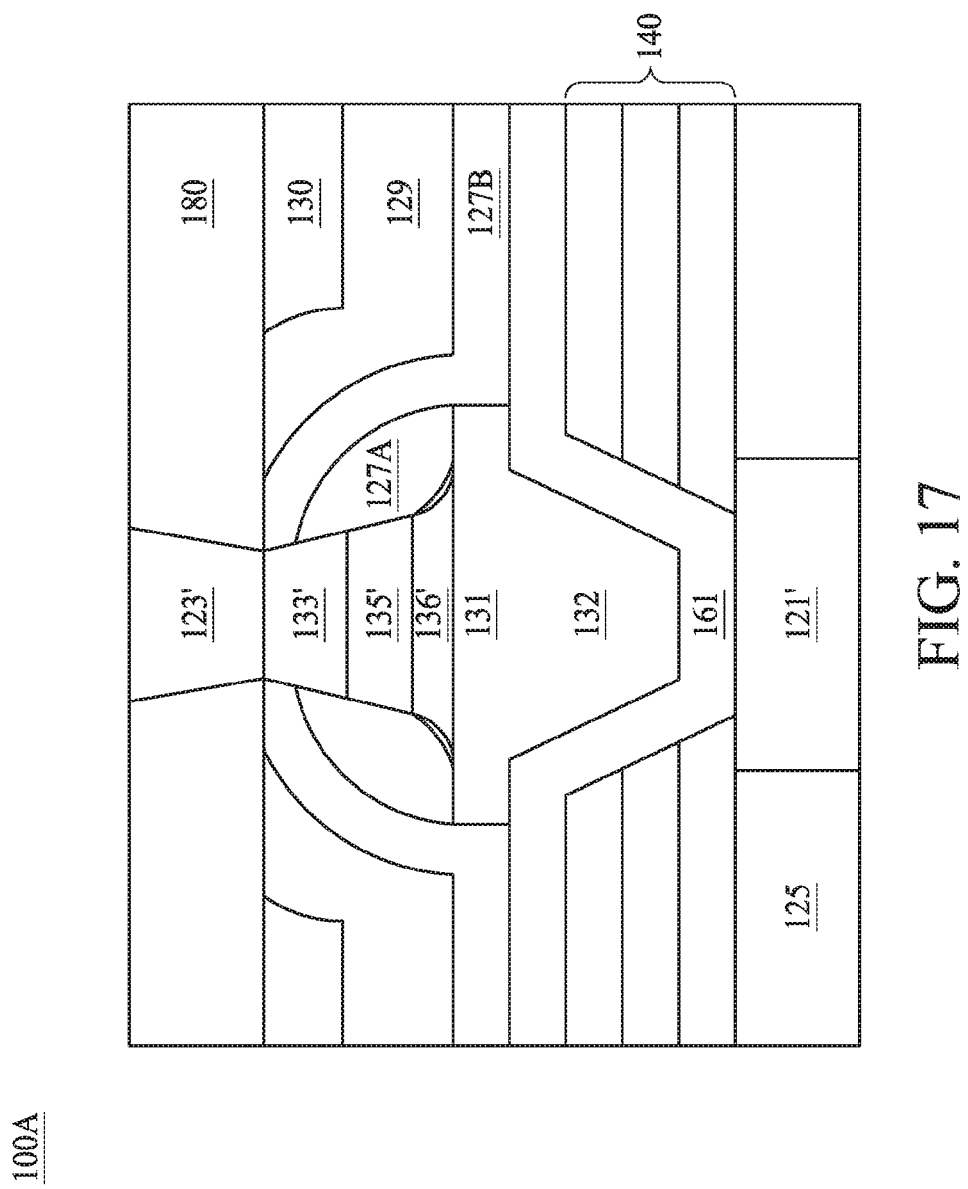

In FIG. 16 and FIG. 17, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. An $(N+1)^{th}$ metal line 123' may be formed from W, and more preferably from copper (Cu), including AlCu (collectively, Cu). In one embodiment, the $(N+1)^{th}$ metal lines 123' are formed using the Damascene operation, which should be familiar to those skilled in the art. First, trenches are etched through the low k dielectric layer. This process can be performed by a plasma etch operation, such as an Inductively Coupled Plasma (ICP) etch. A dielectric liner (not shown) then may be deposited on the trench sidewalls. In some embodiments, the liner materials may include silicon oxide ($SiO_x$) or silicon nitride ($SiN_x$), which may be formed by a plasma deposition process, such as physical vapor deposition (PVD) or chemical vapor deposition (CVD) including plasma enhanced chemical vapor deposition (PECVD). Next, a seed layer of Cu is plated in the trenches. Note that the seed layer of Cu may be plated over a top surface of the top electrode 133'. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Some embodiments of the present disclosure provide a semiconductor structure. The semiconductor structure includes: an $N^{th}$ metal layer; a bottom electrode over the $N^{th}$ metal layer; a seed layer over the bottom electrode; a magnetic tunneling junction (MTJ) over the seed layer; a top electrode over the MTJ; $(N+1)^{th}$ and an metal layer over the top electrode; wherein the seed layer has a thickness greater than about one-third of a thickness of the MTJ. Another semiconductor structure is also disclosed.

Some embodiments of the present disclosure provide a semiconductor structure. The semiconductor structure includes: a bottom electrode; a seed layer over the bottom electrode; a magnetic tunneling junction (MTJ) over the seed layer; and a top electrode over the MTJ; wherein from a cross-sectional view, the seed layer and the MTJ together have a substantial trapezoidal or rectangular shape, and a slope turning point of a sidewall of the substantial trapezoidal or rectangular shape is at a sidewall of the seed layer.

Some embodiments of the present disclosure provide a method for manufacturing a semiconductor structure. The method includes: forming a bottom electrode over an Nth metal layer; forming a seed layer over the bottom electrode; forming a magnetic tunneling junction (MTJ) layer over the seed layer; and forming a top electrode over the MTJ layer; wherein the seed layer has a thickness greater than about one-third of a thickness of an MTJ layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   an $N^{th}$ metal layer;
   a bottom electrode over the $N^{th}$ metal layer;
   a seed layer over the bottom electrode;
   a magnetic tunneling junction (MTJ) over the seed layer;
   a top electrode over the MTJ;
   an $(N+1)^{th}$ metal layer over the top electrode; and
   a layer directly on the side wall of the seed layer, the layer including magnetic materials;
   wherein the seed layer has a thickness greater than about one-third of a thickness of the MTJ.

2. The semiconductor structure of claim 1, wherein the seed layer and the MTJ together have a substantial trapezoidal or rectangular shape from a cross-sectional view.

3. The semiconductor structure of claim 2, wherein the substantial trapezoidal or rectangular shape includes a footing profile, the footing profile being located between a top surface of the bottom electrode and a sidewall of the substantial trapezoidal or rectangular shape, the footing profile having a sidewall slope substantially slower than the sidewall of the substantial trapezoidal or rectangular shape, and the footing profile having a height substantially lower than a height of the seed layer.

4. The semiconductor structure of claim 3, wherein the bottom electrode is substantially laterally wider than at least one of the seed layer, the MTJ, and the top electrode.

5. The semiconductor structure of claim 1, wherein the layer has a height substantially lower than the height of the seed layer.

6. The semiconductor structure of claim 1, wherein magnetism of the seed layer is substantially lower than the MTJ.

7. A semiconductor structure, comprising:
   a bottom electrode;
   a seed layer over the bottom electrode;
   a magnetic tunneling junction (MTJ) over the seed layer; and
   a top electrode over the MTJ;
   wherein a layer directly on the side wall of the seed layer, wherein the layer includes magnetic materials;
   wherein, the seed layer and the MTJ together have a substantial trapezoidal or rectangular shape, and a slope turning point of a sidewall of the substantial trapezoidal or rectangular shape is at a sidewall of the seed layer.

8. The semiconductor structure of claim 7, wherein the seed layer has a thickness of about 60 Å to about 200 Å.

9. The semiconductor structure of claim 8, wherein the MTJ has a thickness of about 150 Å to about 200 Å.

10. The semiconductor structure of claim 7, wherein the seed layer, the MTJ and the top electrode together have a substantial trapezoidal or rectangular shape from a cross-sectional view.

11. The semiconductor structure of claim 10, wherein the bottom electrode is substantially laterally wider than at least one of the seed layer, the MTJ, and the top electrode.

12. The semiconductor structure of claim 7, wherein the magnetic materials include anti-ferromagnetic or ferromagnetic polymers.

13. The semiconductor structure of claim 7, wherein the layer is upwardly extending at most to an edge of a top surface of the seed layer.

14. The semiconductor structure of claim 7, wherein magnetism of the seed layer is substantially lower than the MTJ.

15. A semiconductor structure, comprising:
   a bottom electrode;
   a seed layer over the bottom electrode;
   a magnetic tunneling junction (MTJ) over the seed layer;
   a top electrode over the MTJ; and
   a magnetic layer directly on a sidewall of the seed layer;
   wherein the seed layer has a thickness greater than about one-third of a thickness of the MTJ.

16. The semiconductor structure of claim 15, wherein the magnetic layer includes anti-ferromagnetic or ferromagnetic polymers.

* * * * *